United States Patent [19]

Itoga et al.

[11] Patent Number: 4,900,370
[45] Date of Patent: Feb. 13, 1990

[54] SOLAR BATTERY

[75] Inventors: Kazusue Itoga; Takeshige Ichimura, both of Yokosuka, Japan

[73] Assignee: Fuji Electric Corporate Research and Development Ltd., Japan

[21] Appl. No.: 186,732

[22] Filed: Apr. 22, 1988

Related U.S. Application Data

[63] Continuation of Ser. No. 930,457, Nov. 14, 1986, abandoned.

[30] Foreign Application Priority Data

Feb. 25, 1986 [JP] Japan .................................. 61-39788

[51] Int. Cl.⁴ ............................................ H01L 31/06
[52] U.S. Cl. ..................................... 136/256; 136/258; 357/30; 357/67; 357/71
[58] Field of Search ............ 136/256, 258 AM; 437/2, 437/4, 5; 357/30 J, 30 K, 30 Q, 67, 71

[56] References Cited

U.S. PATENT DOCUMENTS

| | | | |
|---|---|---|---|
| 4,491,682 | 1/1985 | Hamakawa et al. | 136/256 |
| 4,559,552 | 12/1985 | Yamazaki | 357/58 |
| 4,564,533 | 1/1986 | Yamazaki | 427/39 |

FOREIGN PATENT DOCUMENTS

| | | | |
|---|---|---|---|
| 59-94472 | 5/1984 | Japan | 136/258 AM |
| 2139421 | 11/1984 | United Kingdom | 136/258 AM |

OTHER PUBLICATIONS

*Patent Abstracts of Japan*, vol. 9, No. 15 (E-291)(1738), Jan. 22, 1985; JP Application-59-161,881.

*Thin Solid Films*, vol. 102, No. 1, pp. 1-46, Apr. 1983, Lausanne, CH; K. Chopra et al.: "Transparent Conductors-A Status Review", pp. 14-20.

*IEEE Electron Device Letters*, vol. EDL-4, No. 5, pp. 157-159, May 1983, New York, U.S.; H. Iida et al.: "Efficiency of the a-Si:H Solar Cell and Grain Size of SnO2 Transparent Conductive Film", FIG. 1, pp. 157-158, Sections II and III.

*Patent Abstracts of Japan*, vol. II, No. 55 (E-481)(2502), Feb. 20, 1987; JP Application-61-216,489.

Primary Examiner—Aaron Weisstuch
Attorney, Agent, or Firm—Stevens, Davis, Miller & Mosher

[57] ABSTRACT

A method of manufacturing a high efficiency solar battery and a high efficiency solar battery comprising a transparent electrode of $SnO_2$, and a semiconductor layer and a metal electrode formed on the transparent electrode in the stated order. The surface unevenness of the transparent electrode is controlled by forming a dual layer structure. The layer adjacent the transparent substrate comprises an undoped $SnO_2$ layer, having crystal grains growing substantially perpendicular to the substrate, producing an uneven surface. A doped layer containing impurities, such as F, Cl, and Sb is deposited over the undoped layer.

2 Claims, 1 Drawing Sheet

SOLAR BATTERY

This is a continuation of Ser. No. 930,457, filed Nov. 14, 1986, now abandoned.

BACKGROUND OF THE INVENTION

1. Technical Field of the Invention

This invention relates to a solar battery comprising a transparent electrode which can be a transparent conductive film of oxide, and a semiconductor layer of non-crystalline silicon or the like, and a metal electrode formed on the transparent electrode in the stated order.

2. Prior Art and its Problems

A tin oxide ($SnO_2$) film or an indium tin oxide (ITO) film have been extensively employed in the prior art as the materials for the transparent electrode of non-crystalline solar batteries. The fundamental desired characteristics of the transparent electrode are high transmittance, low resistance, and high stability. FIG. 2 shows the structure of a non-crystalline solar battery with a transparent electrode according to the prior art. As shown in FIG. 2, a transparent electrode 2 is formed on a transparent insulated substrate 1, and a photoelectromotive force generating section, namely, a non-crystalline semiconductor layer 3, and a metal electrode 4 are formed on the transparent electrode 2 in the stated order. In addition to the fundamental desired characteristics of a transparent electrode 2 as described above, it would be beneficial to reduce surface reflection loss due to the surface roughness of the transparent electrode. Additional desired characteristics include confinement of light in the semi-conductor layer in order to improve the photoelectric conversion efficiency of the solar battery.

The aforementioned optical confinement effect will be better understood with reference to FIG. 3. The light rays which pass through a transparent insulated substrate 1 are scattered by an uneven surface of transparent electrode 2, and therefore the length of the optical path in a non-crystalline semiconductor layer 3 is increased, as a result of which the amount of light absorption in the photoelectromotive force generating region is increased. If the transparent electrode 2 has an uneven surface as shown in FIG. 3, then the interface between a semiconductor layer 3 and a metal electrode 4 which is formed on the uneven surface is also made uneven. The uneven interface also contributes to the optical confinement effect. A transparent conductive film having the unevenness of its surface thus controlled is essential for forming a high-performance solar battery.

Heretofore, oxide films having an uneven surface as described above were formed according to a method in which the film forming conditions are controlled to make the oxide large in grain size. Alternatively, a method was employed in which the surface of the transparent insulated substrate was made uneven in advance so that the surface of the oxide layer formed thereon is made uneven. However, the former method is disadvantageous in that it is difficult to control the degree of unevenness, and the latter method is also disadvantageous in that the manufacturing process is so intricate that the method is not suitable for either the mass production of solar batteries or for the formation of large solar batteries.

OBJECTS OF THE INVENTION

It is an object of this invention to provide a high performance solar battery in which the above-described difficulties accompanying a convention solar battery are avoided.

It is also an object of this invention to produce a solar battery which has a transparent electrode made up of a transparent conductive film which is large in area and low in resistance and which has an uneven surface.

It is a further object of this invention to provide a method of manufacturing a high performance solar battery having a transparent electrode large in area and low in resistance which has an uneven surface.

SUMMARY OF THE INVENTION

According to the invention, a transparent conductive film is formed as the transparent electrode on the substrate of a solar battery which has a dual layer structure consisting of an impurity undoped layer and an impurity doped layer, so that the surface thereof is made uneven, and the degree of unevenness of the surface can be readily changed by controlling the thickness of the impurities undoped layer. As a result, the effect of confinement of incident light can be obtained as desired, and the performance of the solar battery can be improved. Furthermore, the method of manufacturing the solar battery of the invention is simple, and therefore the solar battery of the invention can be manufactured on a large scale.

The foregoing objects of the invention are also achieved by the provision of a solar battery in which the transparent electrode has a dual layer structure. A dual layer structure of a transparent electrode comprises an impurity undoped layer formed on the substrate and an impurity doped layer formed on the impurity undoped layer.

The present inventors employ the use of crystal grains of tin oxide or indium tin oxide to which impurities (dopants) such as F, Cl, and Sb for electrical conductivity are not added. These grains tend to grow in a direction perpendicular to the substrate, thus producing a layer having an uneven surface. A doped layer of tin oxide or indium tin oxide containing impurities such as F, Cl, and Sb is deposited over this uneven surface. The resulting undoped and doped structure has an uneven surface and comprises a transparent electrode which is low in resistance.

DETAILED DESCRIPTION OF THE INVENTION

Figure 1:
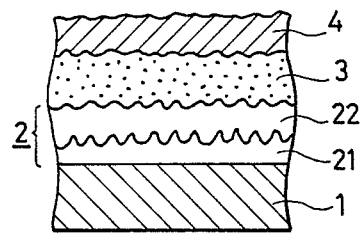
FIG. 1 is a sectional view of a non-crystalline solar battery in one embodiment of this invention.
Figure 2:
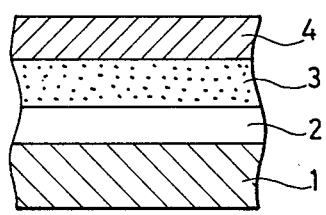
FIG. 2 is a sectional view of a conventional ordinary non-crystalline solar battery according to the prior art.

In each of the Figures the same numerals are employed to describe similar component parts. FIG. 1 shows one example of a solar battery according to the invention in which the transparent electrode 2 is a $SnO_2$ film. The tin oxide is higher in stability and lower in manufacturing cost than the ITO film but of course the indium tin oxide film can be substituted for the tin oxide film. Hereinafter reference to $SnO_2$ film will also apply to ITO film. As shown is FIG. 1 an $SnO_2$ film layer 21 not doped with impurities (hereinafter referred to an "an undoped layer 21") and an $SnO_2$ film layer 22 doped, for instance, with F in order to decrease the resistance (hereinafter referred to as "a doped layer 22") are formed on a transparent insulated substrate 1 such as a glass plate in the stated order. The crystal grains in the undoped layer 21 are longer in a direction perpendicular to the substrate, and therefore, the undoped layer 21 has an uneven surface. The crystals in the doped layer 22 grow with the crystal grains as cores, and therefore the surfaces of the doped layer 22 are also made uneven. The non-crystalline semiconductor layer 3 and metal electrode 4 are deposited on the uneven transparent electrode 2 in a known manner.

Figure 3:
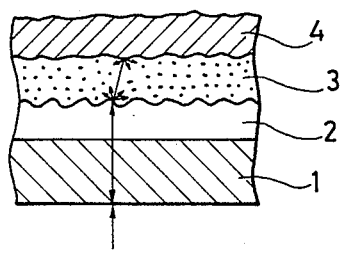
FIG. 3 is a sectional view of a solar battery used in connection with a description of an optical confinement effect provided by uneven surfaces.

The degree of scattering of light rays depends on the degree of unevenness of the surface through which they pass. Reference can be made to the aforementioned description of the scattering effect described in connection with the description of FIG. 3.

The dual layers of the transparent electrode can be made under various conditions such as in the case where the temperature of the substrate is set to about 400° to 550° C., the dual $SnO_2$ film layers are formed under the usual pressures employed according to the known chemical vapor deposition (hereinafter CVD) technique. The following Table 1 illustrates the light ray scattering effect for various film thickness formed by the foregoing CVD technique:

TABLE 1

| Sample | Undoped Layer Thickness ($\mu$m) | Doped Layer Thickness ($\mu$m) | Sheet Resistance (ohms/□) | Transmittance (%) | Light Scattering Degree |
| --- | --- | --- | --- | --- | --- |
| A | 0 | 0.5 | 8 | 85 | 0.01 |
| B | 0.1 | 0.5 | 8 | 84 | 0.07 |
| C | 0.2 | 0.5 | 8 | 82 | 0.14 |
| D | 0.3 | 0.5 | 8 | 80 | 0.23 |

In Table 1, the term "light scattering degree" as used herein is intended to mean a ratio of a scattered light ray intensity to a transmitted light ray intensity, and the term "transmittance" is intended to mean an overall transmittance of the solar battery including the substrate. As is apparent from Table 1, an uneven surface is formed by providing the undoped layer, as a result of which the light scattering degree is increased. Furthermore Table 1 indicates the fact that, by changing the thickness of the undoped layer, the degree of unevenness of the surface is controlled and thus the light scattering degree can be increased.

On the other hand, as the thickness of the undoped layer 21 increases, the total film thickness is increased ant the transmittance is decreased. Because the thickness of the doped layer 22 cannot be decreased in order to maintain the resistance unchanged, it is desirable that the thickness of the undoped layer 21 be made as small as possible. Undoped layer 21 has a thickness less than 0.3 $\mu$m, preferably from 0.08 to 0.2 $\mu$m. Even though the thickness of the undoped layer 21 is made small yet it retains the uneven surface. As a result of research on the conditions of forming the undoped layer 21, it has been found that the degree of unevenness of the surface depends greatly on the speed of growth of the film. In the cases of samples E and F in the following Table 2, the speed of growth of the undoped layer was controlled. That is, in the case of samples B through D in Table 1, the speed of growth was set to 10 Å/sec; while in the cases of samples E and F, the speed of growth was set to 5 Å/sec.

TABLE 2

| Sample | Undoped Layer Thickness ($\mu$m) | Doped Layer Thickness ($\mu$m) | Sheet Resistance (ohms/□) | Transmittance (%) | Light Scattering Degree |
| --- | --- | --- | --- | --- | --- |
| E | 0.08 | 0.5 | 8 | 85 | 0.12 |
| F | 0.08 | 0.5 | 8 | 84.5 | 0.16 |

As is apparent from Table 2, even if the thickness of the undoped layer 21 is small, for example, 0.08 $\mu$m, the film layer shows a high light scattering degree, and has a high transmittance because the total film thickness is 0.58 $\mu$m.

The following Table 3 indicates the relative values of the short-circuiting photocurrents Jsc of non-crystalline solar batteries using the above-described $SnO_2$ films of samples A through F as their transparent electrodes.

TABLE 3

| Sample | A | B | C | D | E | F |
| --- | --- | --- | --- | --- | --- | --- |
| Jsc | 1 | 1.09 | 1.14 | 1.16 | 1.16 | 1.18 |

It is apparent from Table 3 that the dual layer structure increases the light scattering degree and the value Jsc, and as the transmittance is increased by controlling the undoped layer, the value Jsc is further increased.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

We claim:

1. A solar battery comprising a transparent electrode formed on a substrate and a semiconductor film and a metal electrode formed on said transparent electrode in the stated order, characterized in that said transparent electrode comprises an impurity undoped tin oxide layer of a thickness from 0.08 to 0.2 $\mu$m formed on said substrate and an impurity doped tin oxide layer formed on said undoped layer.

2. The solar battery of claim 1, wherein said impurity in said doped layer is one member selected from the group consisting of fluorine, chlorine, antimony, and mixtures thereof.

* * * * *